(12) United States Patent
Miersch et al.

(10) Patent No.: US 6,434,035 B2
(45) Date of Patent: Aug. 13, 2002

(54) MEMORY SYSTEM

(75) Inventors: Ekkehard Miersch, Schönaich; Simon Muff, Regensburg; Jens Pohl, Bernhardswald, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/793,344

(22) Filed: Feb. 26, 2001

Related U.S. Application Data

(63) Continuation of application No. PCT/DE99/02626, filed on Aug. 20, 1999.

(30) Foreign Application Priority Data

Aug. 26, 1998 (DE) .......................................... 198 38 813

(51) Int. Cl.$^7$ ............................................... G11C 5/06
(52) U.S. Cl. ........................................... 365/63; 365/77
(58) Field of Search ................................. 365/63, 51, 77

(56) References Cited

U.S. PATENT DOCUMENTS

| | | |
|---|---|---|
| 5,128,941 A | 7/1992 | Russell |
| 5,313,603 A | 5/1994 | Takishima |
| 5,440,522 A | 8/1995 | Hirano |
| 5,737,761 A | 4/1998 | Holland et al. |

*Primary Examiner*—David Nelms
*Assistant Examiner*—Thong Le
(74) *Attorney, Agent, or Firm*—Laurence A. Greenberg; Werner H. Stemer; Gregory L. Mayback

(57) ABSTRACT

The memory system has data lines for transmitting data between memory components and at least one control unit. The memory system is a distributed system with at least one central control unit and at least one group control unit, the group control unit having at least one first data line for connecting the group control unit to the central control unit, and second data lines for connecting a group of memory components to the group control unit.

13 Claims, 1 Drawing Sheet

MEMORY SYSTEM

CROSS-REFERENCE TO RELATED APPLICATION

This application is a continuation of copending International Application No. PCT/DE99/02626, filed Aug. 20, 1999, which designated the United States.

BACKGROUND OF THE INVENTION

Field of the Invention

The invention lies in the memory technology field and relates, more specifically, to a memory system having data lines for transmitting data between memory components and at least one control unit.

Prior art memory systems have an interface unit which contains a central control unit and data lines. The data lines are to be found with control lines in a bus system which connects memory components in quasi-parallel.

The prior art memory systems have the disadvantage that the access time increases as the size of the memory increases.

SUMMARY OF THE INVENTION

The object of the present invention is to provide a memory system which overcomes the above-noted deficiencies and disadvantages of the prior art devices and methods of this general kind, and which further shortens the access time to data held in the memory components to a minimum.

With the above and other objects in view there is provided, in accordance with the invention, a memory system, comprising:

a plurality of memory components;

a central control unit;

a group control unit having a plurality of data lines for transmitting data between the memory components and the central control unit;

the data lines including a first data line connected to the central control unit, and second data lines connected to a group of the memory components.

In other words, the invention achieves the above objects by virtue of the fact that a memory system of the generic type is configured such that it has at least one central control unit and at least one group control unit, the group control unit having at least one first data line for connecting the group control unit to the central control unit, and second data lines for connecting a group of memory components to the group control unit.

The invention thus aims to provide a memory system which permits hierarchically organized access to data in individual memory components or memory chips.

In accordance with an added feature of the invention, at least one subgroup control unit is connected to the second data lines and third data lines connected between the subgroup control unit and the memory components, whereby the memory components are connected to the central control unit via the first data line, the group control unit, the second data lines, the subgroup control unit, and the third data lines.

In accordance with an additional feature of the invention, the third data lines are electrically isolated from one another by the subgroup control unit. Preferably, the third data lines radiate in a star pattern from the subgroup control unit.

Similarly, in accordance with another feature of the invention, the second data lines are electrically isolated from one another by the group control unit. Preferably, the second data lines radiate in a star pattern from the group control unit.

In accordance with a further feature of the invention, a plurality of first data lines are electrically isolated from one another by the group control unit. In the preferred embodiment, the first data lines radiate in a star pattern from the group control unit.

In accordance with again another feature of the invention, the group control unit and/or the subgroup control unit and/or the central control unit contains a full buffer chip or is formed by a full buffer chip.

One of the subjects of the invention is thus an embodiment of a new organization form for the memory components. In this context, memory components are split into m groups of memory components. Suitable components, in particular amplifiers, such as buffers or repeaters, are used to electrically isolate the memory components from one another.

The central control unit is connected to $M=m*x$ data lines, where x denotes the number of data lines to the individual memory components. The data path between the central control unit and a processor unit, such as a CPU (Central Processor Unit), likewise has $M=m*x$ data lines.

Expediently, an even greater number of memory components are driven by the central control unit by virtue of the fact that the second data lines are connected to at least one subgroup control unit, and that the memory components are connected via the central control unit, the first data line, the group control unit, the second data lines, the subgroup control unit, and via third data lines, the third data lines connecting the memory components to the subgroup control unit.

The object of this particularly advantageous embodiment of the memory system is thus to provide at least three hierarchical levels of connections for the memory components.

This provides a memory system for a large number of memory components.

In principle, implementation of the invention requires only that at least one group control unit be present in addition to the central control unit. However, the efficiency of the memory system is increased by a greater number of group control units.

Further control units, which are provided in addition to the particularly expedient subgroup control units and connect additional hierarchical levels, make it possible to connect several hundred memory components. Such a greater number of hierarchical levels and various control units is expedient, above all, when there is a particularly large number of memory components. Particularly fast access times can be produced by virtue of the fact that the data lines are DC-isolated from one another, and the control unit to which they are connected connects them electrically only in selected switching states.

In the case of the particularly advantageous memory system having at least one subgroup control unit, it is therefore expedient that the third data lines are electrically isolated from one another by the subgroup control unit. A particularly preferred embodiment of the memory system is distinguished by the fact that the third data lines leave the subgroup control unit in a star form.

It is likewise expedient that the second data lines are electrically isolated from one another by the group control unit.

A likewise preferred embodiment of the memory system is distinguished by the fact that the second data lines leave the group control unit in a star form.

It is particularly expedient that the memory system has a plurality of first data lines, and that the first data lines are electrically isolated from one another by the group control unit.

A further preferred embodiment of the memory system is distinguished by the fact that the first data lines leave the group control unit in a star form.

It is particularly expedient that the data lines are used to implement bidirectional data interchange between the central control unit and the individual memory components in two-point networks. In this context, two-point lines having bidirectional driver and receiver circuits are involved. The choice of internal resistance for the respectively active one of the two bidirectional driver and receiver circuits in the two-point line allows the line system to be closed so that it is always active, using its characteristic impedance. Thus, signals which are reflected from an open (that is to say, remote from an active driver) end of the line and return to the driver are absorbed. This is true for the drivers on both sides of the bidirectional network, the driver opposite the active driver being in a high-impedance state.

Other features which are considered as characteristic for the invention are set forth in the appended claims.

Although the invention is illustrated and described herein as embodied in a memory system, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawing.

BRIEF DESCRIPTION OF THE DRAWING

The FIGURE is a plan view of a memory system according to the invention.

DESCRIPTION OF THE PREFERRED EMBODIMENTS

Figure 1:
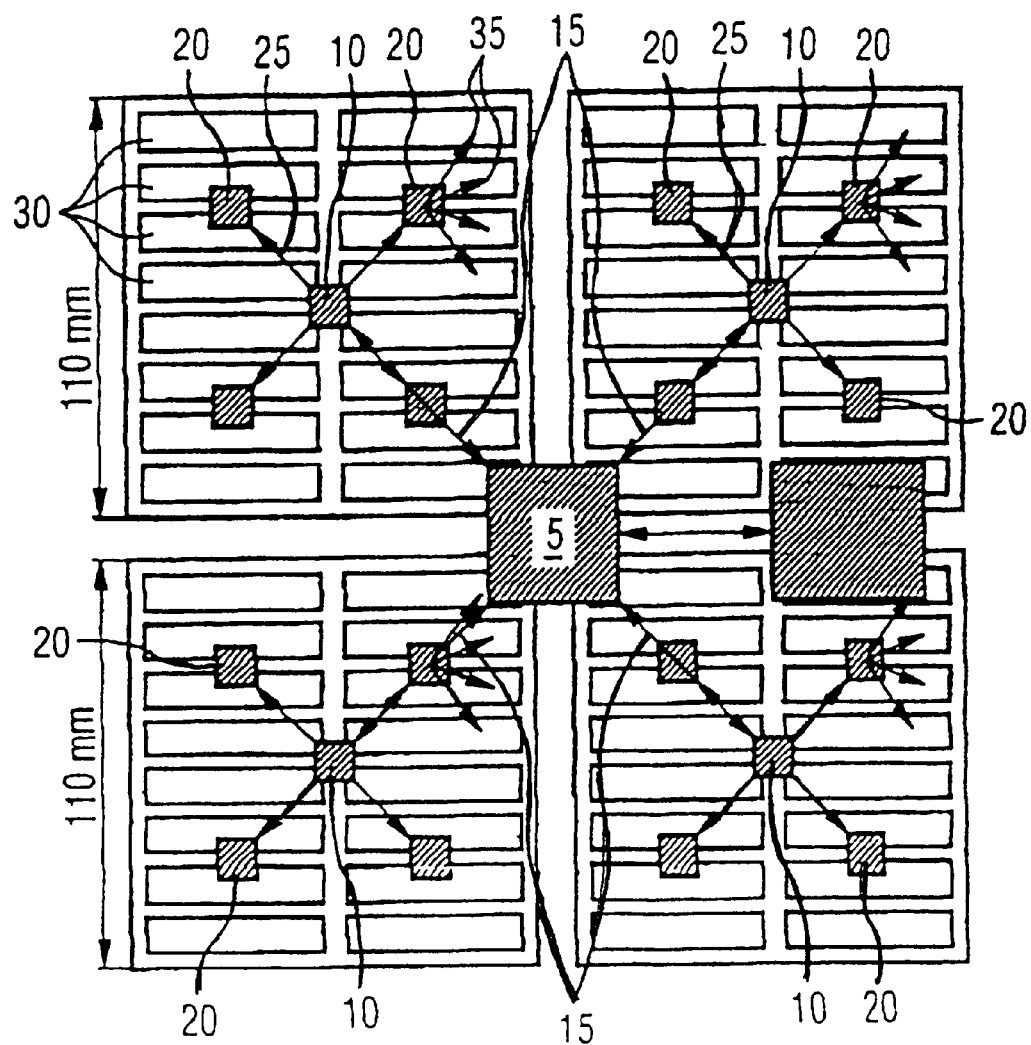

Referring now to the sole FIGURE of the drawing in detail the memory system of the invention has a central control unit 5 connected to group control units 10 via first data lines 15.

The group control units 10 are connected to subgroup control units 20 via second data lines 25.

The subgroup control units 20 are connected to memory components 30 via third data lines 35.

A particularly good use of space can be achieved by virtue of the fact that the central control unit 5 is surrounded by four group control units 10, and that the group control units 10, for their part, are surrounded by four respective subgroup control units 20 with the memory components 30 connected to them. The memory components contain a respective multiplicity of cell arrays.

The subgroup control units 20 and the memory components 30 connected to them form memory modules. The memory modules preferably contain four carriers for memory components. The carriers for memory components preferably hold one memory component in the case of single-sided mounting, and preferably hold two memory components in the case of double-sided mounting.

Addressing takes place using a signal allocated to each of the cell arrays in a memory component. The addressing of the memory component is controlled such that a chip select address selects as active only the specific data path to the specific memory component which, on the basis of memory organization, holds the data information and is the destination of the specific address.

The data line, that is to say the data path it produces, has x data bits, where x is 18, for example.

The memory system has the further advantage that adding further memory components in the context of memory extension does not affect the access time to the data in the individual memory components.

The access time depends solely on the path between the central control unit and the memory component, this path being stipulated in a maximum configuration.

The access time to each of the memory components is determined by the signal delay time on the data lines 15, 25 and 35 used, by the switching times of the central control unit and of the associated group control unit or subgroup control unit, and by the data access time to the memory components. The access time therefore depends fundamentally only on the number of hierarchical levels formed by the control units, but not on the number of memory components.

Even if a maximum configuration is not used, that is to say if there is only a partial presence of memory components 30 in the memory system, the memory system according to the invention is much faster than the prior art memory systems.

This is particularly true when main memories with a large number of memory components 30 are involved.

The subgroup control units 20 are preferably in the form of buffer chips and have a data length of x bits. The subgroup control units address a number bs chip carriers. If each of the chip carriers has both sides fitted with a total of two memory components, the subgroup control unit 20 addresses bs memory components 30. Although it is also possible for the subgroup control unit 20 to drive more than 1*bs, or, if the chip carriers are occupied on both sides, two bs memory components 30, this would result in a plurality of memory components being connected in series on a common bus. It is more advantageous to refrain from such series connection generally, however, in order to prevent disturbing reflections on memory components which are not activated.

It is advantageous that, from each subgroup control unit 20 having B data drivers, only x data drivers are activated, where: $B=b*x$, and preferably: $b=bs+1$, and bs is preferably equal to 4, which means that: $b=5$. In this case, 18 data drivers plus associated control drivers are thus activated. The number b is preferably one greater than bs because a clock signal (clock) is additionally transmitted.

In the illustrated case with 16 subgroup control units and 4 group control units 10, the central control unit 5 addresses a total of 128 memory components 30. The number 128 is obtained from the fact that 16 subgroup control units 20 each drive 8 memory components, that is to say a total of 128 memory components 30.

To drive 128 memory components 30, a total of 21 control units are required, that is to say one central control unit 5, four group control units 10 and 16 subgroup control units 20. Preferably, not only the subgroup control units 20 but also the central control unit 5 and the group control units 10 are in the form of buffer chips.

Such an arrangement is expedient, above all, when the objective is to achieve the highest possible memory capacity for the entire memory system using memory components which are comparatively simple to manufacture. Thus, in the case of memory components 30 each having a memory capacity of 72 Mbits, a total of 4096 Gbytes=4*16*4*2*72 Mbits can be addressed. With bs=4 and direct binary implementation, 7 additional address lines would be necessary.

If the individual memory components 30 have a higher memory capacity, for example 288 Mbits, it is more expedient to arrange the memory components in a memory system which has just a central control unit 5 and group control units 10. In this case 4*16*1*2=128*288 Mbits= 4096 Gbytes are driven by just one central control unit 5 and four group control units 10. An interface unit of the memory system is designed such that both data, meaning the stored information, and control signals are transmitted. The control signals allow the data to be stored and comprise the addresses, the clock signals and chip select signals, and hence appropriate path select signals.

In the case illustrated, the central control unit 5 has a 72-bit bit data bus comprising m=4 data buses of x=18 bits each for each of the m=4 memory component groups.

By contrast, the group control units 10 have a data bus with a data width of just 18 bits.

Hence, a wide data bus is necessary only between the central control unit 5 and a central processor unit (CPU).

The cited values for m, b, bs, x are to be understood as exemplary only as they relate to the illustrated, particularly advantageous embodiment of the memory system.

The novel memory system implements an addressing scheme (programmed in the central control unit 5, for example) in which, within a group of memory components 30, a respective memory component 30—from a maximum of two memory components 30 mounted on the same chip carrier—is selected at the end of a data line 35. Hence, only one driver group of the full buffer chips is formed, namely the one situated directly in the data path to the selected memory component. This means that driver groups which are not situated in the data path, and also their control signals, are removed from switching, like control units which, although they are situated in the group of memory components 30, are not in the direct path to the selected memory component 30. The addressing scheme thus minimizes not only the number of drivers switching for a memory component 30, but also the number of buffer chips and memory components switching for each access operation to a memory, and hence also minimizes the power requirement and the heat produced in the memory device.

In contrast to the lines with a multi-stub bus system which are known in the prior art, such a line design permits data transmission with the group delay time for the signals.

We claim:

1. A memory system, comprising:
   a plurality of memory components;
   a central control unit;
   a group control unit having a plurality of data lines for transmitting data between said plurality of memory components and said central control unit; and
   said plurality of data lines including a plurality of first data lines connected to said central control unit, and second data lines connected to a group of said plurality of memory components, said second data lines radiating in a star pattern from said group control unit.

2. The memory system according to claim 1, which further comprises at least one subgroup control unit connected to said second data lines and third data lines connected between said subgroup control unit and said memory components, whereby said memory components are connected to said central control unit via said plurality of first data lines, said group control unit, said second data lines, said subgroup control unit, and said third data lines.

3. The memory system according to claim 2, wherein said third data lines are electrically isolated from one another by said subgroup control unit.

4. The memory system according to claim 3, wherein said third data lines radiate in a star pattern from said subgroup control unit.

5. The memory system according to claim 1, wherein said second data lines are electrically isolated from one another by said group control unit.

6. The memory system according to claim 1, wherein said plurality of first data lines are electrically isolated from one another by said group control unit.

7. The memory system according to claim 2, wherein said subgroup control unit contains a full buffer chip.

8. The memory system according to claim 2, wherein said subgroup control unit is formed by a full buffer chip.

9. The memory system according to claim 1, wherein said group control unit contains a full buffer chip.

10. The memory system according to claim 1, wherein said group control unit is formed by a full buffer chip.

11. The memory system according to claim 1, wherein said central control unit contains a full buffer chip.

12. The memory system according to claim 1, wherein said central control unit is formed by a full buffer chip.

13. A memory system, comprising:
    a plurality of memory components;
    a central control unit;
    a group control unit having a plurality of data lines for transmitting data between said plurality of memory components and said central control unit; and
    said plurality of data lines including a plurality of first data lines connected to said central control unit, and second data lines connected to a group of said plurality of memory components, said plurality of first data lines radiating in a star pattern from said group control unit.

* * * * *